United States Patent
Treusch

(10) Patent No.: US 6,768,753 B2
(45) Date of Patent: Jul. 27, 2004

(54) RELIABLE DIODE LASER STACK

(75) Inventor: Hans-Georg Treusch, Tucson, AZ (US)

(73) Assignee: Spectra Physics, Tucson, AZ (US)

(*) Notice: Subject to any disclaimer, the term of this patent is extended or adjusted under 35 U.S.C. 154(b) by 0 days.

(21) Appl. No.: 10/152,956

(22) Filed: May 22, 2002

(65) Prior Publication Data

US 2003/0219047 A1 Nov. 27, 2003

(51) Int. Cl.[7] .................................................. H01S 3/00
(52) U.S. Cl. ........................................ 372/38.09; 372/33
(58) Field of Search ............................ 372/38.09, 33, 372/36

(56) References Cited

U.S. PATENT DOCUMENTS

| | | | |
|---|---|---|---|
| 4,627,062 A | | 12/1986 | Bender .......................... 372/36 |
| 4,716,568 A | | 12/1987 | Scifres et al. ................... 372/36 |
| 4,871,920 A | * | 10/1989 | Stabile et al. ................. 250/551 |
| 5,138,621 A | * | 8/1992 | Goto et al. ............... 372/38.02 |
| 5,305,344 A | | 4/1994 | Patel et al. ..................... 372/50 |
| 5,311,530 A | | 5/1994 | Wagner et al. ................. 372/36 |
| 5,550,852 A | | 8/1996 | Patel et al. ..................... 372/33 |
| 5,636,234 A | * | 6/1997 | Takagi .......................... 372/43 |
| 5,715,264 A | * | 2/1998 | Patel et al. ..................... 372/36 |
| 6,061,369 A | * | 5/2000 | Conradi .......................... 372/6 |
| 6,137,816 A | * | 10/2000 | Kinbara ................. 372/29.012 |
| 6,185,240 B1 | * | 2/2001 | Jiang et al. ..................... 372/50 |
| 6,205,162 B1 | * | 3/2001 | Shodo ..................... 372/38.04 |
| 6,215,132 B1 | * | 4/2001 | Nettelbladt et al. ........... 257/93 |
| 6,359,919 B1 | * | 3/2002 | Ishikawa et al. .............. 372/45 |
| 6,388,803 B1 | * | 5/2002 | Knox ....................... 359/337.1 |
| 6,399,963 B2 | * | 6/2002 | Sugawara et al. ............. 257/96 |
| 6,486,491 B1 | * | 11/2002 | Najda .......................... 257/18 |
| 6,509,651 B1 | * | 1/2003 | Matsubara et al. .......... 257/461 |
| 6,576,291 B2 | * | 6/2003 | Bawendi et al. ............. 427/215 |
| 6,639,354 B1 | * | 10/2003 | Kojima et al. .............. 313/498 |
| 2004/0057479 A1 | * | 3/2004 | Stephens et al. .............. 372/36 |

* cited by examiner

*Primary Examiner*—Don Wong
*Assistant Examiner*—James Menefee
(74) *Attorney, Agent, or Firm*—Howard R. Popper

(57) ABSTRACT

A laser diode stack includes a serially connected plurality of laser diode bars mounted on heat sinks. Connected in parallel with each laser diode is a respective safety diode which has a higher band gap than its associated laser diode. The safety diode remains nonconductive so long as the associated laser diode is operational. Should the laser diode fail in an open circuit condition, the respective safety diode responds to the open circuit voltage to restore continuity to the serially connected chan of laser diodes.

1 Claim, 1 Drawing Sheet

RELIABLE DIODE LASER STACK

FIELD OF THE INVENTION

This invention relates to high power laser applications in which the required optical output power is greater than can be obtained from a single laser or laser bar as a consequence of which multiple laser devices must be assembled in stacks.

BACKGROUND OF THE INVENTION

Certain applications in the printing and welding industries, for example, require high intensity, high power laser beams. To provide the requisite power it is the practice to make an electrical connection of the assemblage of laser diode bars in the stack so that they are in series with each other. For example, certain high power diode pumped solid state laser applications may require up to 100 diodes to be connected in series in one cavity and up to 8 cavities may be needed. The typical current through a laser diode in a stack is 60A at a forward voltage of 1.8V. While such a stack assemblage permits the desired optical output power to be achieved, there is a problem should the heat incidentally generated in the stack cause any of the solder connections to melt. The resulting open circuit interrupts current to the laser stack and shuts down the laser's optical output. The shut down of the optical output power is at least inconvenient to the user and also may have more serious consequences in ruining the product being operated upon.

U.S. Pat. No. 5,550,852 has heretofore shown that it can be advantageous to connect a reverse laser diode in parallel with each operative laser diode to provide a path for reverse currents which may occur during testing, power-up, etc., that otherwise would be damaging to the active laser diode. In the '852 patent the reverse diode has electrical properties similar to those of the operative laser diode so that the reverse diode and the active diode could be fabricated at the same time. While the reverse diode is therefore useful, it does not solve the problem of maintaining operational continuity of a laser bar stack should one of the series connected laser diodes fail in an open-circuit condition.

SUMMARY OF THE INVENTION

In accordance with the principles of the present invention a stack serially connected laser diodes is prevented from failing in operational continuity when one of the laser diodes fails in an open circuit condition by proving an individual safety diode for each diode in the stack connected in parallel with its corresponding laser diode. The safety diode is fabricated so that it exhibits a higher forward voltage (higher band gap) than its corresponding laser diode. Should the laser diode fail in an open circuit condition, the voltage impressed across the open circuit will rise since it is no longer shunted by the low resistance of the failed laser diode. The higher voltage is sufficient to allow the safety diode to take over the function of the failed laser diode thereby maintaining continuity of the current path through the serially connected laser diodes of the stack. Advantageously, the safety diode is mounted on the same heat sink as its companion laser diode so that it can receive efficient cooling when it is called into operation. The light output from the safety diode when it turns on in response to the failure of its associated laser diode may advantageously be used to provide a different color light to signal the status of the assembly of multiple diode lasers.

BRIEF DESCRIPTION OF THE DRAWING

The foregoing objects and features may become more apparent from a reading of the ensuing description, together with the drawing, in which.

DETAILED DESCRIPTION

Figure 1:
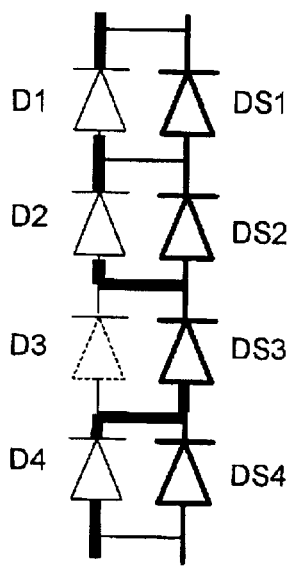
FIG. 1 schematically shows a series connection of laser diodes each of which is shunted by a higher band gap safety diode in accordance with the invention.

In FIG. 1 an illustrative chain of laser diodes D1, D2, D3, D4 is connected in series with a current source (not shown) so that each of the laser diodes is operational and makes a contribution to the total optical output. In shunt with each of the laser diodes D1, D2, D3, D4 is a respective safety diode DS1, DS2, DS3, DS4. Let it be assumed that each of laser diodes D1, D2, D3, D4 has a band gap voltage of 1.5 v. Let each of safety diodes DS1, DS2, DS3, DS4 have a band gap voltage of 2.0 v. In normal operation, only laser diodes D1, D2, D3, D4 will provide optical output. Safety diodes DS1, DS2, DS3, DS4 will all remain dark.

Now should one of the laser diodes, such as diode D3 (shown in dotted outline) fail in an open circuit condition, the voltage appearing across the open circuit will rise above 1.5 v. As soon as the open circuit voltage exceeds 2.0 v, safety diode DS3 will become operational. When safety diode DS3 turns on, a current path will be completed which may be traced through the series connection of laser diodes D1 and D2, safety diode DS3 and laser diode D4. The completion of this current path allows each of diodes D1, D2 and D4 to again contribute to the optical output.

Figure 2:
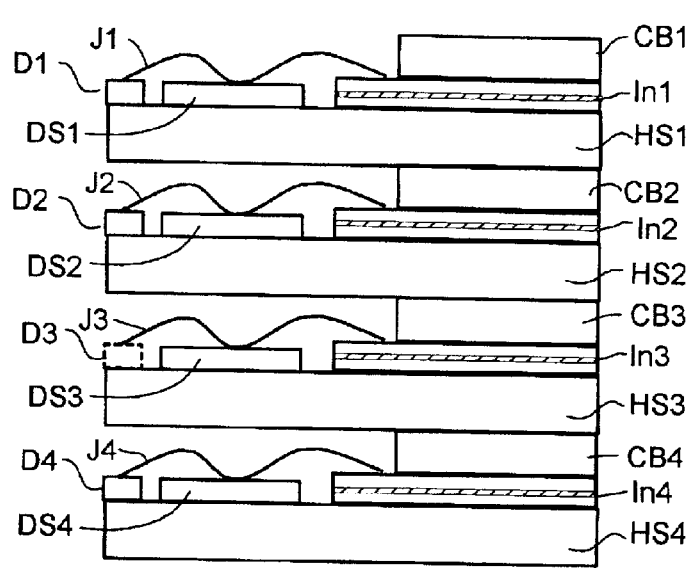
FIG. 2 shows the corresponding physical arrangement of laser diodes and safety diodes mounted on heat sinks for efficient cooling.

Referring to FIG. 2 the physical arrangement of four, series-connected laser diode assemblies is shown. A typical assembly includes a laser diode D1 and a jumper J1 connecting laser diode D1 in parallel with safety diode DS1. Jumper J1 is conductively connected to a respective conductive spacer block CB1. An insulator In1 electrically isolates conductive spacer block CB1 from heat sink HS1. Heat sink HS1 typically is a copper shell having internal, fluid cooled microchannels (not shown). Diodes D1 and DS1 are soldered to the heat sink HS1.

The current path through the stack in normal operation goes from the current source (not shown) to spacer block CB1, jumper J1, laser diode D1 to heat sink HS1. From heat sink HS1 the current path continues through spacer block CB2, jumper J2, laser diode D2 heat sink HS2, spacer block CB3, jumper J3, laser diode D3, heat sink HS3, spacer block CB4, jumper J4 laser diode D4 to heat sink HS4 whence the circuit is completed back to the current source. In normal operation, all of laser diodes D1 through D4 are powered up and illuminate and safety diodes DS1 through DS4 are dark.

Should laser diode DS3 fail in an open circuit condition, the current path instead of being completed through diode D3 will now go from jumper J3 through safety diode DS3 and thence through heat sink HS3 and the remaining components of the series circuit described above. When safety diode DS3 turns on, its light output may be detected to signal a changed status of the diode stack due to the failure of laser diode D3.

What has been described is deemed to be illustrative of the principles of the invention. It should be apparent that safety diodes DS1–DS4 have been illustrated as being mounted back from the lefthand light output edge of the heat sinks. This illustrates an assumption that the entire width of the output edge is required to accommodate the maximum power required from each of the laser diodes D1–D4. An alternative, lower power design is possible where each safety diode would share the output edge of the heat sink with its respective laser diode so that should the respective laser diode fail the safety diode would come into operation not only to maintain continuity of the laser stack but also to contribute its optical output to the stack. Further and other modifications will be apparent to those skilled in the art and may be made without however departing from the spirit and scope of the invention.

What is claimed is:

1. A chain of serially connected of laser diode assemblies, each assembly having a laser diode and a respective safety diode connected electrically in parallel with and poled the same as its respective laser diode, each said laser diode having a band gap lower than that of its respective safety diode, said lower band gap causing each said laser diode normally to both emit light and maintain a continuous current path through said serially connected chain of assemblies, each said safety diode normally remaining non-conducting when said respective laser diode provides light output, any of said safety diodes automatically becoming conductive to complete said current path across its respective laser diode when its respective laser diode fails in a open circuit condition.

* * * * *